(12) United States Patent
Jonas et al.

(10) Patent No.: US 10,107,879 B2
(45) Date of Patent: Oct. 23, 2018

(54) LOW-LOSS PERSISTENT CURRENT SWITCH WITH HEAT TRANSFER ARRANGEMENT

(71) Applicant: KONINKLIJKE PHILIPS N.V., Eindhoven (NL)

(72) Inventors: Philip Alexander Jonas, Delmar, NY (US); Alexander Akhmetov, Schenectady, NY (US); Robert Adolph Ackermann, Schenectady, NY (US); Philippe Abel Menteur, Niskayuna, NY (US); Glen George Pfleiderer, Voorheesville, NY (US); Matthew Voss, Albany, NY (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 500 days.

(21) Appl. No.: 14/652,004

(22) PCT Filed: Sep. 22, 2013

(86) PCT No.: PCT/IB2013/058736
§ 371 (c)(1),
(2) Date: Jun. 12, 2015

(87) PCT Pub. No.: WO2014/096995
PCT Pub. Date: Jun. 26, 2014

(65) Prior Publication Data
US 2015/0323626 A1    Nov. 12, 2015

Related U.S. Application Data

(60) Provisional application No. 61/737,939, filed on Dec. 17, 2012.

(51) Int. Cl.
*G01V 3/00*    (2006.01)
*G01R 33/38*    (2006.01)
(Continued)

(52) U.S. Cl.
CPC ..... *G01R 33/3804* (2013.01); *G01R 33/3815* (2013.01); *H01F 6/04* (2013.01); *H01F 6/006* (2013.01)

(58) Field of Classification Search
CPC .... G01R 33/3804; G01R 33/3815; H01F 6/04
See application file for complete search history.

(56) References Cited

U.S. PATENT DOCUMENTS 4,926,647 A * 5/1990 Dorri .................. F25D 3/10
174/15.4
5,361,055 A    11/1994 Peck
(Continued)

FOREIGN PATENT DOCUMENTS

JP    03322981 B2    9/2002
JP    2009246231    * 10/2009
(Continued)

OTHER PUBLICATIONS

Thermal Conductivity at Low Temperatures, Part 1: Theory, 2010, available at http://www.mtm-inc.com/ac-20101018-thermal-conductivity-at-low-temperatures-part-1-theory.html, Fig. 2.*
(Continued)

*Primary Examiner* — Daniel Miller

(57) ABSTRACT

An apparatus including a persistent current switch of a superconducting material which is electrically superconducting at a superconducting temperature and electrically resistive at a resistive mode temperature which is greater than the superconducting temperature. The apparatus further includes a first heat exchange element; a convective heat dissipation loop thermally coupling the persistent current switch to the first heat exchange element; a second heat exchange element spaced apart from the first heat exchange element; and a thermally conductive link thermally coupling the persistent current switch to the second heat exchange element. The first heat exchange element is disposed above
(Continued)

the persistent current switch. The thermally conductive link may have a greater thermal conductivity at the superconducting temperature than at a second temperature which is greater than the superconducting temperature.

18 Claims, 3 Drawing Sheets

(51) Int. Cl.
      *G01R 33/3815*    (2006.01)
      *H01F 6/04*    (2006.01)
      *H01F 6/00*    (2006.01)

(56) References Cited

U.S. PATENT DOCUMENTS

| | | | |
|---|---|---|---|
| 5,512,870 A | 4/1996 | Salasoo | |
| 5,513,498 A * | 5/1996 | Ackermann | F25B 25/005 |
| | | | 62/51.1 |
| 5,757,257 A | 5/1998 | Doi | |
| 6,646,836 B2 | 11/2003 | Yoshikawa | |
| 7,383,688 B2 | 6/2008 | Van Hasselt | |
| 8,134,434 B2 | 3/2012 | Diederichs | |
| 2009/0176649 A1 * | 7/2009 | Takahashi | H01L 39/20 |
| | | | 505/211 |
| 2010/0248968 A1 * | 9/2010 | Stautner | G01R 33/3804 |
| | | | 505/162 |
| 2012/0094840 A1 | 4/2012 | Tanaka | |

FOREIGN PATENT DOCUMENTS

JP        2009246231 A    *   10/2009
WO     1997011472 A1      3/1997

OTHER PUBLICATIONS

J.F. O'Hanlon, A User's Guide to Vacuum Technology, John Wiley & Sons, 2005, p. 274, Fig. 15.7.*
Ackermann, Cryogenic Regenerative Heat Exchangers, Springer Science+Business Media New York, 1997, Chapter 6, Regenerative Cryogenic Refrigerators, p. 218.*
McColm, Dictionary of Ceramic Science and Engineering, Springer Science & Business Media, Aug. 30, 2013, p. 345.*
Poggiani, R. "Materials and Components of Possible Interest for Cryogenic Operation of Einstein Telescope", University of Pisa, ET-026-09, Issue 1, 2009.

* cited by examiner

LOW-LOSS PERSISTENT CURRENT SWITCH WITH HEAT TRANSFER ARRANGEMENT

CROSS-REFERENCE TO PRIOR APPLICATIONS

This application is the U.S. National Phase application under 35 U.S.C. § 371 of International Application No. PCT/IB2013/058736, filed on Sep. 22, 2013, which claims the benefit of U.S. Provisional Patent Application No. 61/737,939, filed on Dec. 17, 2012. These applications are hereby incorporated by reference herein.

TECHNICAL FIELD

The present invention generally pertains to a low-loss persistent current switch, and in particular, to a low-loss persistent current switch for use with a superconducting persistent magnet in a cryogenic environment.

BACKGROUND AND SUMMARY

Superconducting magnets are used in a variety of contexts, including nuclear magnetic resonance (NMR) analysis, and magnetic resonance imaging (MRI). To realize superconductivity, a magnet is maintained in a cryogenic environment at a temperature near absolute zero. Typically, the magnet includes one or more electrically conductive coils which are disposed in a cryostat and are cooled by a cryogenic fluid such as liquid helium.

Many superconducting magnets operate in "persistent mode." In persistent mode, one or more superconducting electrically conductive coils which form the superconducting magnet is initially energized with current from an external power supply to start up its magnetic field. Once the desired magnetic field is obtained, the power supply is disconnected from the magnet and the magnet maintains the current and the magnetic field due to its superconductivity.

To operate in persistent mode, a persistent current switch is typically provided across the electrical leads, which supplies the energizing current to the magnet. During a magnet energization period (e.g., at startup), the persistent current switch is placed into a resistive state such that it allows the superconducting electrically conductive coils to be energized by the current from the power supply. Once the magnet has been energized, the persistent current switch is switched to a superconducting state for normal persistent mode operation of the superconducting magnet.

Persistent mode switches can be switched between a superconducting state and a resistive state by the application of heat. When the persistent current switch is at a cryogenic temperature (e.g., about 4° K), it is in a superconducting state and has near zero resistance. However, when the persistent current switch is heated to a resistive mode temperature, which is typically greater than the superconducting temperature, it is in the resistive state. In the resistive state, the persistent current switch is not "open" like a typical electrical switch, but rather has a resistance typically between a few ohms and tens of ohms.

During charging of the superconducting magnet the persistent current switch is heated to the resistive mode temperature and a voltage is applied across the switch to charge the magnet. This typically dissipates energy in the persistent current switch. Typically, the persistent current switch is located in the very low temperature (cryogenic) environment, and energy dissipated in the switch is typically transferred as a heat load into that environment. This heat may be removed using a low temperature refrigeration system or through boiling cryogens. Refrigeration systems are typically inefficient at removing heat in very low temperature (cryogenic) environments. As a result, this typically requires very large, expensive, resistive persistent current switches to be employed, or costly cryogens are allowed to be boiled off which are replaced after the magnet has been charged. Neither of these things is desirable.

One aspect of the present invention can provide an apparatus including: a cryostat having an enclosure, and a thermal shield disposed within the enclosure, the thermal shield defining an inner region, and further defining a thermal insulation region disposed between the thermal shield and the enclosure; a cold head having a first stage element disposed in the thermal insulation region, and a second stage element disposed in the inner region and being configured to operate at lower temperature than a temperature of the first stage element; a first heat exchange element thermally coupled to the first stage element of the cold head; a second heat exchange element thermally coupled to the second stage element of the cold head; an electrically conductive coil disposed within the enclosure and configured to produce a magnetic field when an electrical current is passed therethrough; a persistent current switch disposed within the enclosure and connected across the electrically conductive coil, wherein the persistent current switch includes a superconducting material which is electrically superconducting at a superconducting temperature and electrically resistive at a resistive mode temperature which is greater than the superconducting temperature; a persistent current switch heater configured to be selectively activated and deactivated so as to heat the persistent current switch to the resistive mode temperature; and a thermally conductive link thermally coupling the persistent current switch to the second heat exchange element, wherein the persistent current switch is thermally coupled via a convective heat dissipation loop to the first heat exchange element, and wherein the thermally conductive link includes a material which has a first thermal conductivity at the superconducting temperature and a second thermal conductivity at a second temperature which is greater than the superconducting temperature, wherein the first thermal conductivity is greater than the second thermal conductivity.

In some embodiments, the apparatus can further include a superconducting convection cooling loop disposed within the enclosure and connected to the second heat exchange element, the superconducting convection cooling loop having a cryogenic fluid disposed therein and being configured to cool the electrically conductive coil to the superconducting temperature.

In some embodiments, the apparatus can further include a controller configured to activate the persistent current switch heater during a magnet energization period wherein the electrically conductive coil is brought to the superconducting temperature and charged to produce the magnetic field with a particular strength, the controller further being configured to deactivate the persistent current switch heater during an operating period following the magnet energization period once the electrically conductive coil is charged to produce the magnetic field with the particular strength.

In some embodiments, during the magnet energization period, more heat can be transferred from the persistent current switch to the first heat exchange element via the convective heat dissipation loop than is transferred from the persistent current switch to the second heat exchange element via the thermally conductive link.

In some embodiments, the superconducting temperature is about 4° K and the first heat exchange element is at a temperature of about 40° K.

Another aspect of the present invention can provide a method of operating a device including an electrically conductive coil, a persistent current switch connected across the electrically conductive coil, a persistent current switch heater, and a first heat exchange element thermally coupled via a convective heat dissipation loop to the persistent current switch, wherein the persistent current switch includes a superconducting material which is superconducting at a superconducting temperature and electrically resistive at a resistive mode temperature which is greater than the superconducting temperature. The method can include, during a magnet energization period: cooling the electrically conductive coil to the superconducting temperature; heating the current switch heater so as to raise a temperature of the persistent current switch to the resistive mode temperature; applying energy to the electrically conductive coil so as to charge the electrically conductive coil to produce a magnetic field with a desired strength; and while applying the energy to the electrically conductive coil, dissipating heat from the persistent current switch to the first heat exchange element via the convective heat dissipation loop.

In some embodiments, the method can further include disposing the first heat exchange element above the persistent current switch, and wherein during the magnet energization period the first heat exchange element is at a first temperature which is greater than the superconducting temperature.

In some embodiments, the first temperature is about 40° K and the superconducting temperature is about 4° K.

In some embodiments, the method can further include during an operating period subsequent to the magnet energization period, dissipating heat from the persistent current switch to a second heat exchange element via a thermally conductive link, wherein the second heat exchange element is at the superconducting temperature during the operating period.

In some embodiments, the thermally conductive link can include a material which has a first thermal conductivity at the superconducting temperature and a second thermal conductivity at a second temperature which is greater than the superconducting temperature, wherein the first thermal conductivity is greater than the second thermal conductivity.

In some embodiments, during the magnet energization period and during the operating period, the first heat exchange element can be at a first temperature which is substantially greater than the superconducting temperature.

In some versions of these embodiments, the superconducting temperature is about 4° K and the first temperature is about 40° K.

Yet another aspect of the present invention can provide an apparatus including: a persistent current switch including a superconducting material which is electrically superconducting at a superconducting temperature and electrically resistive at a resistive mode temperature which is greater than the superconducting temperature; a convective heat dissipation loop thermally coupling the persistent current switch to the first heat exchange element; a second heat exchange element spaced apart from the first heat exchange element; and a thermally conductive link thermally coupling the persistent current switch to the second heat exchange element.

In some embodiments, the convective heat dissipation loop can include a two phase heat pipe.

In some embodiments, the thermally conductive link can include a material which has a first thermal conductivity at the superconducting temperature and a second thermal conductivity at a second temperature which is greater than the superconducting temperature, wherein the first thermal conductivity is greater than the second thermal conductivity.

In some embodiments, the apparatus can further include a cryostat having: an enclosure; and a thermal shield disposed within the enclosure and defining a thermal insulation region disposed between the thermal shield and the enclosure.

In some embodiments, the first heat exchange element can include the thermal shield.

In some embodiments, the thermal insulation region can include a vacuum.

In some embodiments, a persistent current switch heater configured to be selectively activated and deactivated can be provided, wherein when the persistent current switch heater is activated it heats the persistent current switch to the resistive mode temperature; a first heat exchange element.

In some embodiments, the apparatus can further include a superconducting convection cooling loop disposed within the enclosure and connected to the second heat exchange element, the superconducting convection cooling loop having a cryogenic fluid disposed therein and being configured to cool the persistent current switch to the superconducting temperature.

BRIEF DESCRIPTION OF THE DRAWINGS

The present invention will be more readily understood from the detailed description of exemplary embodiments presented below considered in conjunction with the accompanying drawings, in which.

DETAILED DESCRIPTION

The present invention will now be described more fully hereinafter with reference to the accompanying drawings, in which embodiments of the present invention are shown. The present invention may, however, be embodied in different forms and should not be construed as limited to the embodiments set forth herein. Rather, these embodiments are provided as teaching examples of the invention. Within the present disclosure and claims, when something is said to have approximately a certain value, then it means that it is within 10% of that value, and when something is said to have about a certain value, then it means that it is within 25% of that value.

Figure 1:
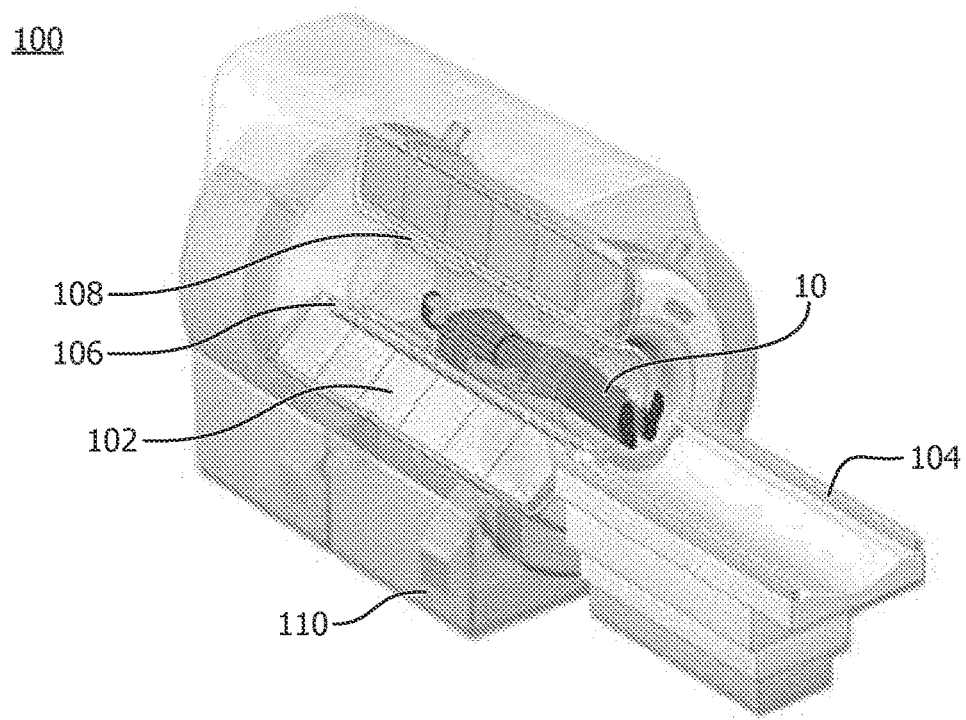
FIG. 1 illustrates an exemplary embodiment of a magnetic resonance imaging (MRI) apparatus.

FIG. 1 illustrates an exemplary embodiment of a magnetic resonance imaging (MRI) apparatus 100. MRI apparatus 100 includes a magnet 102; a patient table 104 configured to hold a patient 10; gradient coils 106 configured to at least partially surround at least a portion of patient 10 for which MRI apparatus 100 generates an image; a radio frequency coil 108 configured to apply a radio frequency signal to at least the portion of patient 10 which is being imaged, and to alter the alignment of the magnetic field; and a scanner 110 configured to detect changes in the magnetic field caused by the radio frequency signal.

The general operation of an MRI apparatus is well known and therefore will not be repeated here.

Figure 2:
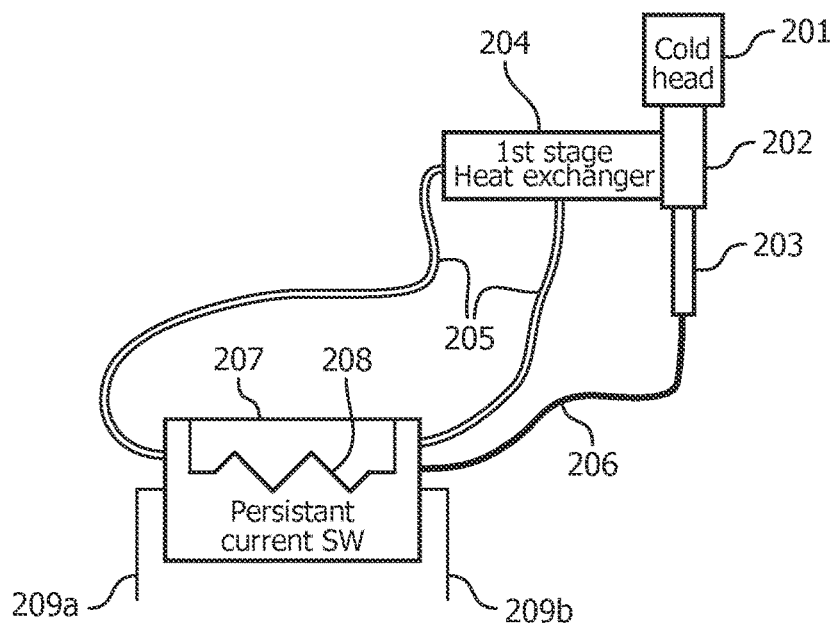
FIG. 2 illustrates exemplary embodiment of a persistent current switch with a heat dissipation arrangement.

FIG. 2 illustrates an exemplary embodiment of a persistent current switch with a heat dissipation arrangement which may be employed in an MRI apparatus such as MRI apparatus 100. In particular, FIG. 2 illustrates: a cold head 201 having associated therewith a first stage element 202 and a second stage element 203; a first stage heat exchanger, or heat transfer element, 204; a convective heat dissipation loop 205; a thermally conductive heat dissipation link 206; a persistent current switch 207; a persistent current switch heater 208; and first and second electrically conducting charging links 209a and 209b.

First heat exchanger 204 is in thermal communication with first stage element 202 of cold head 201. Here, first stage element 202 generally operates at a higher temperature (e.g., about 40° K) than second stage element 203 (e.g., about 4° K).

Convective heat dissipation loop 205 connects persistent current switch 207 with first heat exchanger 204. In some embodiments, convective heat dissipation loop 205 may include a two-stage heat pipe as discussed in greater detail below.

Thermally conductive heat dissipation link 206 preferably connects persistent current switch 207 with second stage element 203 of cold head 201, and/or a second heat exchanger (not shown in FIG. 2), which may be connected to second stage element 203 of cold head 201.

Persistent current switch 207 includes a superconducting material which is electrically superconducting at a superconducting temperature (e.g., about 4° K) and which is electrically resistive at a resistive mode temperature which is greater than the superconducting temperature.

Persistent current switch heater 208 may be selectively activated/turned-on and deactivated/turned-off by applying a heating current thereto, for example under the control of a controller (not shown in FIG. 2).

As will be discussed in greater detail below, when persistent current switch 207 is heated by persistent current switch heater 208 so as to be in a resistive state, and when a charging voltage is applied between first and second electrically conducting charging links 209a and 209b, then heat is generated by a resultant current passing through persistent current switch 207. The arrangement illustrated in FIG. 2 provides two paths for dissipating heat from persistent current switch 207: a first path via convective heat dissipation loop 205 to a first heat exchange element, which may include first stage element 202 of cold head 201 and/or first stage heat exchanger 204, and a second path via thermally conductive heat dissipation link 206 to a second heat exchange element, which may include second stage element 203 of cold head 201 and/or a second heat exchanger (not shown in FIG. 2), which can be thermally coupled or connected to second stage element 203. Although only two paths for heat dissipation are shown, other embodiments of the present invention can include any number of heat exchange stages/elements and heat dissipation paths.

Operation of the persistent current switch 207 and heat dissipation arrangement shown in FIG. 2 may be better explained with reference to FIG. 3, which illustrates an exemplary embodiment of a superconducting magnet system 300. Superconducting magnet system may be employed in an MRI apparatus such as MRI apparatus 100, which can include persistent current switch 207 and the heat dissipation arrangement of FIG. 2.

Superconducting magnet system 300 can include the arrangement shown in FIG. 2, including cold head 201 having associated therewith first stage element 202 and second stage element 203; first heat exchanger, or heat transfer element, 204; convective heat dissipation loop 205; thermally conductive heat dissipation link 206; persistent current switch 207; persistent current switch heater 208; and first and second electrically conducting charging links 209a and 209b.

Superconducting magnet system 300 can also include a second heat exchanger, or heat transfer, element 305, a compressor 306, a superconducting convection cooling loop 308, one or more electrically conducting coil(s) 313 (which when energized includes a superconducting magnet), and a magnet controller 380. Superconducting convection cooling loop 308 is thermally coupled to second stage element 203 of cold head 201 via second heat exchanger 305. As illustrated in FIG. 3, persistent current switch 207 is connected across the terminals of electrically conducting coil(s) 313.

Superconducting magnet system 300 can further includes a cryostat 301 having an enclosure, or outer vacuum vessel, 316 and a thermal shield 315 disposed within enclosure 316. Thermal shield at least partially thermally isolates an inner region 314a within enclosure 316 from a thermal insulation region 314b disposed between thermal shield 315 and enclosure 316. Here, it should be understood that in general, thermal shield 315 may not completely enclose inner region 314a. For example, as shown in FIG. 3, thermal shield 315 may include openings or apertures for allowing various structures such as convective heat dissipation loop 205, a portion of cold head 201, electrical wires or probes, etc., to pass between inner region 314a and thermal insulation region 314b. In some embodiments, thermal shield 315 may include a structure such as an open-ended cylinder which is not a closed structure but which nevertheless generally defines a region therein. Other shapes and configurations are possible.

Figure 3:
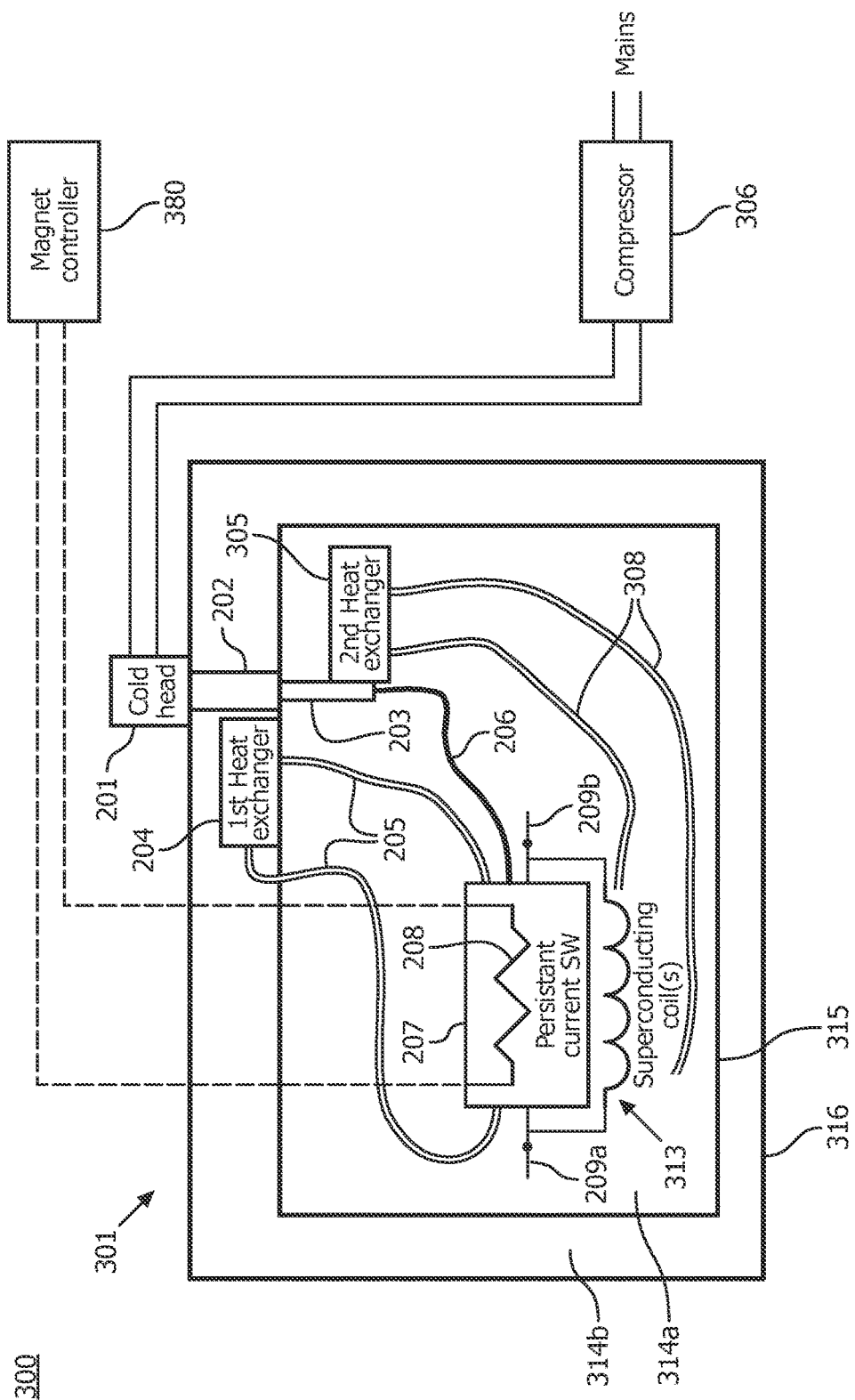
FIG. 3 illustrates exemplary embodiment of a superconducting magnet system which may be employed in an MRI apparatus and which includes a persistent current switch with a heat dissipation arrangement.

In general, superconducting magnet system 300 may have a number of other elements other than those shown in FIG. 3, including, for example, a power supply for supplying power to electrically conducting coil(s) 313 during system startup, one or more sensors connected to magnet controller 380 for monitoring operation of superconducting magnet system 300, etc.

In one embodiment, second stage element 203, convective heat dissipation loop 205, thermally conductive heat dissipation link 206, persistent current switch 207, persistent current switch heater 208, first and second electrically conducting charging links 209a and 209b, second heat exchanger 305, superconducting convection cooling loop 308, and electrically conducting coil(s) 313 are disposed within inner region 314a. First heat exchanger 204 and first stage element 202 of cold head 201 are disposed within thermal insulation region 314b. Compressor 306 and controller 380 are disposed outside of cryostat 301.

Beneficially, inner region 314a and thermal insulation region 314 inside of enclosure 316 include an evacuated space where any gas, liquid, etc. has been removed, comprising a first vacuum except for the areas occupied by defined structures (e.g., second stage element 203 of cold head 201, convective heat dissipation loop 205, thermally conductive heat dissipation link 206, persistent current switch 207, persistent current switch heater 208, first and second electrically conducting charging links 209a and 209b, second heat exchanger 305, superconducting convection cooling loop 308, electrically conducting coil(s) 313, and first stage element 202 of cold head 201, etc.).

In some embodiments, thermal shield 315 is thermally coupled or connected to first stage element 202 of cold head 201. In some embodiments, first heat exchanger 204 is attached to, or is part of, thermal shield 315.

Thermally conductive heat dissipation link 206 is connected between persistent current switch 207 and a second heat exchange element disposed within inner region 314a, for example second stage element 203 of cold head 201 or second heat exchanger 205 which is thermally coupled or connected to second stage element 203. Beneficially, in some embodiments thermally conductive heat dissipation link 206 includes a material with has a first thermal conductivity at a superconducting temperature (e.g., about 4° K) and a second thermal conductivity at a second temperature (e.g., about 40° K), which is greater than the superconducting temperature, wherein the first thermal conductivity is greater than the second thermal conductivity.

In some embodiments, magnet controller 380 may include memory (e.g., volatile and/or nonvolatile memory) and a processor (e.g., a microprocessor). The processor may be configured to execute computer program instructions stored in the memory to cause magnet system 300 to perform one or more actions and/or processes as described herein.

An explanation of an exemplary operation of persistent current switch 207 and its associated heat dissipation arrangement will now be described with respect to FIG. 3.

In operation, a first heat exchange element, which may include first heat exchanger 204 and/or first stage element 202 of cold head 201, can be disposed so that it lies above persistent current switch 207. In this regard, the first heat exchange element may or may not be disposed directly above persistent current switch, but beneficially, the first heat exchange element is disposed at a higher altitude, or position, with respect to earth, than persistent current switch 207.

In operation, superconducting convection cooling loop 308 has a cryogenic fluid (e.g., liquid or gaseous helium) disposed therein. Cold head 201 is driven by compressor 306 to cool the cryogenic fluid in superconducting convection cooling loop 308. In turn, superconducting convection cooling loop 308 cools electrically conducting coil(s) 313 to a superconducting temperature (e.g., about 4° K) where electrically conducting coil(s) 313 are superconducting. At this time, first heat exchanger 204 is disposed in thermal insulation region 314b, and may be thermally coupled to thermal shield 315. Accordingly, first heat exchanger 204 is at a first temperature (e.g., about 40° K), which is greater than the superconducting temperature (e.g., about 4° K) of superconducting convection cooling loop 308 electrically conducting coil(s) 313 in inner region 314a.

During start-up or magnet energization, electrically conducting coil(s) 313 are charged to produce a magnetic field with a desired field strength. To accomplish this, persistent current switch heater 208 is activated or turned-on (e.g., under control of magnet controller 380) so as to heat persistent current switch 207 to a resistive mode temperature, which is greater than the superconducting temperature. When persistent current switch 207 is heated to the resistive mode temperature, it is in the resistive state with an impedance in a range of a few ohms or tens of ohms. With persistent current switch 207 in the resistive state, electrically conducting coil(s) 313 are energized by applying power from a power supply (external to cryostat 301 and not illustrated in FIG. 3). This can be performed via first and second electrically conducting charging links 209a and 209b, thereby causing electrically conducting coil(s) 313 to produce a magnetic field. The magnetic field produced by electrically conducting coil(s) 313 may be ramped up to a desired or target field strength by continuing to supply power from the power supply.

While persistent current switch 207 is in a resistive state, the voltage across conducting charging links 209a and 209b causes a current to flow through persistent current switch 207, which in turn causes energy dissipation in persistent current switch 207. This energy dissipation takes the form of heat which raises the temperature of persistent current switch 207. In some embodiments, after current flows through persistent current switch 207 from the power supply, the heat generated by the resistive losses may be sufficient to maintain persistent current switch at or above the resistive mode temperature so as to continue to operate in the resistive state. In some embodiments, persistent current switch heater 208 may be deactivated or turned-off at this point while power continues to be supplied from the power supply.

During the magnet energization period, convective heat dissipation loop 205 transfers heat from persistent current switch 207 to first heat exchanger 204. In an exemplary embodiment, the first heat exchanger 204 is disposed outside of thermal shield 315 in the thermal insulation region 314b. Further, the first heat exchanger 204 may be at the first temperature (e.g., about 40° K), which is greater than the superconducting temperature (e.g., about 4° K). In some embodiments, the temperature of persistent current switch 207 is greater than the first temperature of first heat exchange element 204. Accordingly, with first heat exchanger 204 disposed above persistent current switch 207, heat may flow convectively via convective heat dissipation loop 205 from persistent current switch 207 to first heat exchanger 204. In this manner, a heat load generated by persistent current switch 207 during the magnet energization period may be transferred to first stage element 202 of cold head 201, which is disposed outside of thermal shield 315, rather than to the colder, less efficient, second stage element 203 of cold head 201, which is disposed in the inner region 314a.

In some embodiments, convective heat dissipation loop 205 may include a two-phase heat pipe. In that case, for example, a liquid may flow by gravity from first heat exchanger 204 to persistent current switch 207, where heat from persistent current switch 207 changes the liquid to a gas which then flows by convection upward to first heat exchanger 204 where heat is removed and the gas is liquefied.

As noted above, at this time, during the magnet energization period, persistent current switch 207 is at an elevated temperature (e.g., >40° K), which is greater than the superconducting temperature (e.g., about 4° K) due to the power being dissipated therein. Accordingly, in some embodiments thermally conductive heat dissipation link 206 is connected to persistent current switch 207. The thermally conductive heat dissipation link 206 is at an elevated temperature and has a thermal conductivity which is greater than its thermal conductivity at the superconducting temperature. Accordingly, in such embodiments, little or no heat may be transferred from persistent current switch 207 to the second heat exchange element (e.g., second stage element 203 of cold head 201 or second heat exchanger 305) in inner region 314a via thermally conductive heat dissipation link 206. Beneficially, this reduces or prevents boiling of the cryogenic liquid in superconducting convection cooling loop 308, which is thermally coupled to second stage element 203 of cold head 201.

After electrically conducting coil(s) 313 have been energized to generate a magnetic field of a desired field strength, persistent heater switch 208 is deactivated or turned off (e.g., under control of magnet controller 308) and the power supply is disconnected from electrically conducting coil(s) 313 as magnet system 300 transitions to normal operation. Accordingly, the temperature of persistent temperature switch decreases.

Once persistent current switch 207 reaches a temperature which is less than the first temperature of first heat exchanger 204 (e.g., about 40° K), then convective heat dissipation loop 205 stagnates, and little or no heat is transferred from the higher temperature first heat exchanger 204 to the colder persistent current switch 207, which is located beneath it. As the temperature of persistent current switch 207 drops, in some embodiments, the thermal conductivity of thermally conductive heat dissipation link 206 increases so as to convey an increasing amount of heat from persistent current switch 207 to the second heat exchange element (e.g., second stage element 203 of cold head 201 or second heat exchanger 305) in inner region 314a. Eventually persistent current switch 207 cools to the superconducting temperature (e.g., about 4° K) and switches to its superconducting state. At this point, magnet system 300 operates normally, in the persistent mode, as discussed above.

Figure 4:
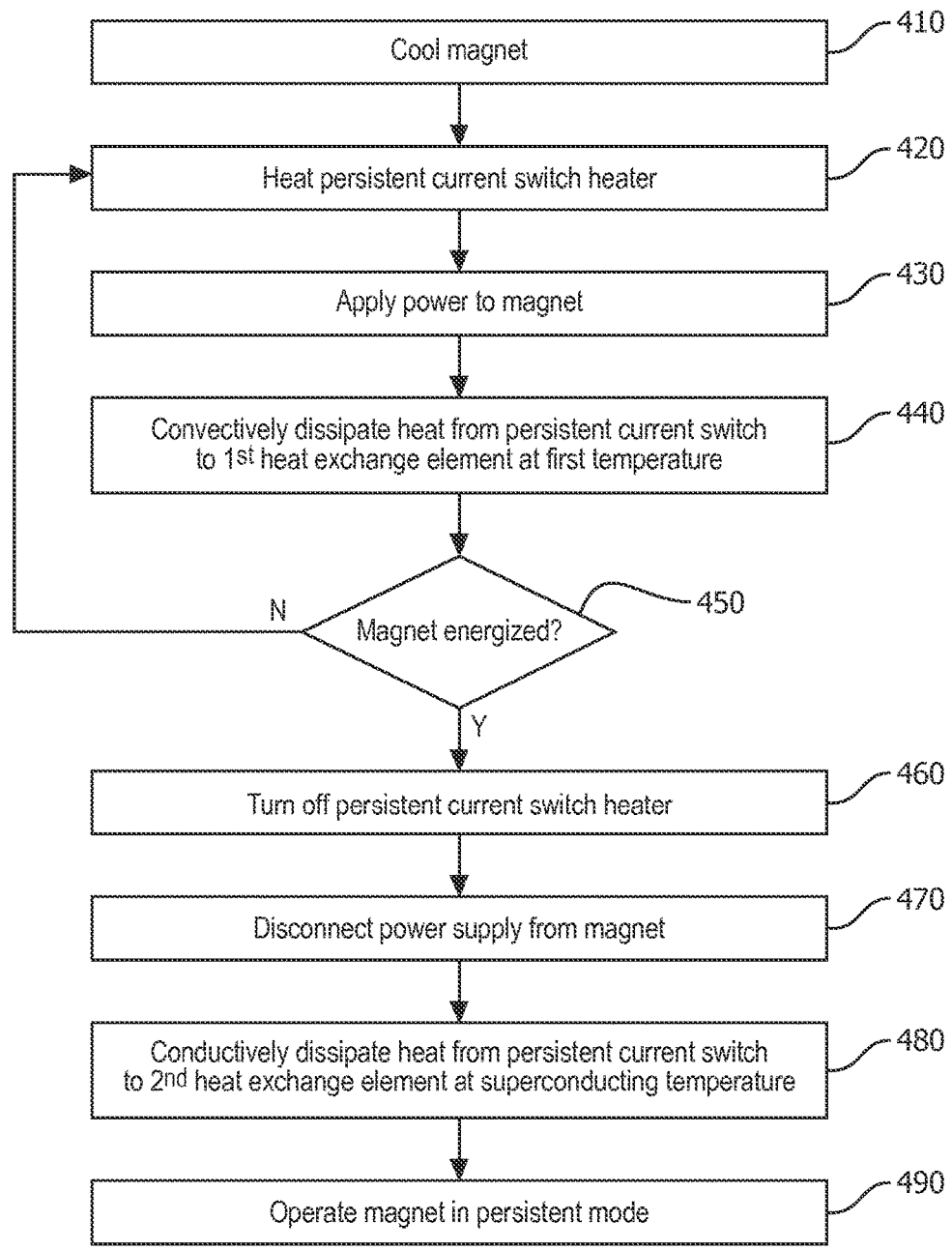
FIG. 4 is a flowchart illustrating an exemplary method of energizing and operating a magnet system with a superconducting magnet and a persistent current switch.

FIG. 4 is a flowchart illustrating an exemplary method 400 of energizing and operating a magnet system with a superconducting magnet and a persistent current switch, such as magnet system 300.

In a step 410, the magnet (e.g., one or more electrically conducting coils) is cooled to a superconducting temperature (e.g., about 4° K), for example, by a compressor and a cold head.

In a step 420, a magnet energization period begins and a persistent current switch heater is turned on or activated so as to heat a persistent current switch to a resistive mode temperature such that the persistent current switch is in a resistive state.

In a step 430, energy is applied from a power supply outside of to charge the magnetic field of the magnet.

In a step 440, heat is convectively dissipated via a convection heat dissipation loop from the persistent current switch to a first heat exchange element. The first heat exchange element is typically at a first temperature (e.g., about 40° K) that is greater than the superconducting temperature of the magnet system and is disposed above the persistent current switch. Beneficially, as described above, the first heat exchange element may be disposed in a thermal insulation region of the cryostat and outside of a thermal shield provided in the cryostat of the magnet system.

In a step 450, it is determined (e.g., by a magnet controller) whether the magnet has been energized to produce a magnetic field of a desired strength or intensity. In some embodiments, this should be done by a measuring the current through the magnet (e.g., electrically conducting coil(s) 313), or by using a field probe.

If it is determined in step 450 that the magnet has not yet been energized to the desired magnetic field strength, then steps 420 through 440 are continued.

However, if it is determined in step 450 that the magnet has been energized to the desired magnetic field strength, then the process proceeds to step 460.

In a step 460, the persistent current switch heater may be turned off or deactivated. In some embodiments, the persistent current switch heater may have already been turned off at an earlier step if the current flowing through the persistent current switch generated sufficient heat dissipation to maintain the persistent current switch in the resistive state. In that case, the persistent current switch remains deactivated or turned off after it has been determined in step 450 that the magnet has been energized to the supply the magnetic field with the desired field strength.

In a step 470, the power supply is disconnected from the magnet (e.g., one or more electrically conducting coils) to begin a normal operating period of the magnet system.

In a step 480, the persistent current switch cools to a temperature which is less than the first temperature of the first heat exchange element. At this point, the convective heat dissipation loop stops operating, and little or no heat is transferred via the convective heat dissipation loop from the higher temperature first heat exchange element to the colder persistent current switch which is located beneath it. At this time, heat is dissipated from the persistent current switch to a second heat exchange element, which, for example, may be at the superconducting temperature. Beneficially, in some embodiments the second heat exchange element may be disposed in an inner region of the cryostat of the magnet system, within a heat shield provided in the cryostat.

In a step 490, the persistent current switch cools to the superconducting temperature and switches to its superconducting state. At this point, the magnet system operates normally, in the persistent mode, as discussed above.

While preferred embodiments are disclosed herein, many variations are possible which remain within the concept and scope of the invention. Such variations would become clear to one of ordinary skill in the art after inspection of the specification, drawings and claims herein. The present invention therefore is not to be restricted except within the scope of the appended claims.

What is claimed is:

1. An apparatus, comprising:
a cryostat having an enclosure and a thermal shield disposed within the enclosure, the thermal shield defining an inner region, and further defining a thermal insulation region disposed between the thermal shield and the enclosure;
a cold head having a first stage element disposed in the thermal insulation region, and a second stage element disposed in the inner region and being configured to operate at a lower temperature than a temperature of the first stage element;
a first heat exchange element thermally coupled to the first stage element of the cold head;
a second heat exchange element thermally coupled to the second stage element of the cold head;
an electrically conductive coil disposed within the enclosure and configured to produce a magnetic field when an electrical current is passed therethrough;
a persistent current switch disposed within the enclosure and connected across the electrically conductive coil, wherein the persistent current switch comprises a superconducting material which is electrically superconducting at a superconducting temperature and electrically resistive at a resistive mode temperature which is greater than the superconducting temperature;
a persistent current switch heater configured to be selectively activated and deactivated so as to heat the persistent current switch to the resistive mode temperature; and
a convective heat dissipation loop; and a thermally conductive link thermally coupling the persistent current switch to the second heat exchange element,
wherein the persistent current switch is thermally coupled via the convective heat dissipation loop directly to the first heat exchange element, and
wherein the thermally conductive link comprises a material which has a first thermal conductivity at the superconducting temperature and has a second thermal conductivity at a second temperature which is greater than the superconducting temperature, wherein the first thermal conductivity is greater than the second thermal conductivity.

2. The apparatus of claim 1, further comprising a superconducting convection cooling loop disposed within the enclosure and connected to the second heat exchange element, the superconducting convection cooling loop having a cryogenic fluid disposed therein and being configured to cool the electrically conductive coil to the superconducting temperature.

3. The apparatus of claim 2, further comprising a controller configured to activate the persistent current switch heater during a magnet energization period wherein the electrically conductive coil is brought to the superconducting temperature and charged to produce the magnetic field with a particular strength, the controller further being configured to deactivate the persistent current switch heater during an operating period following the magnet energization period once the electrically conductive coil is charged to produce the magnetic field with the particular strength.

4. The apparatus of claim 3, wherein during the magnet energization period more heat is transferred from the persistent current switch to the first heat exchange element via the convective heat dissipation loop than is transferred from the persistent current switch to the second heat exchange element via the thermally conductive link.

5. The apparatus of claim 1, wherein the superconducting temperature is about 4° K and the first heat exchange element is at a temperature of about 40° K.

6. A method of operating a device comprising an electrically conductive coil, a persistent current switch connected across the electrically conductive coil, a persistent current switch heater, and a first heat exchange element thermally coupled to a first stage element of a two-stage cold head, and also thermally coupled via a convective heat dissipation loop to the persistent current switch without a second heat exchange element being included in the convective heat dissipation loop, wherein the persistent current switch comprises a superconducting material which is superconducting at a superconducting temperature and electrically resistive at a resistive mode temperature which is greater than the superconducting temperature, and a thermally conductive link thermally coupling the persistent current switch to the second heat exchange element, wherein the thermally conductive link comprises a material which has a first thermal conductivity at the superconducting temperature and has a second thermal conductivity at a second temperature which is greater than the superconducting temperature, wherein the first thermal conductivity is greater than the second thermal conductivity, the method comprising, during a magnet energization period:
cooling the electrically conductive coil to the superconducting temperature;
heating the current switch heater so as to raise a temperature of the persistent current switch to the resistive mode temperature;
applying energy to the electrically conductive coil so as to charge the electrically conductive coil to produce a magnetic field with a desired strength; and
while applying the energy to the electrically conductive coil, dissipating heat from the persistent current switch to the first heat exchange element via the convective heat dissipation loop which does not include the second heat exchange element.

7. The method of claim 6, further comprising disposing the first heat exchange element above the persistent current switch, and wherein during the magnet energization period the first heat exchange element is at a first temperature which is greater than the superconducting temperature.

8. The method of claim 7, wherein the first temperature is about 40° K and the superconducting temperature is about 4° K.

9. The method of claim 6, further comprising, during an operating period subsequent to the magnet energization period, dissipating heat from the persistent current switch to a second heat exchange element via a thermally conductive link, wherein the second heat exchange element is at the superconducting temperature during the operating period.

10. The method of claim 9, wherein during the magnet energization period and during the operating period, the first heat exchange element is at a first temperature which is substantially greater than the superconducting temperature.

11. The method of claim 10, wherein the superconducting temperature is about 4° K and the first temperature is about 40° K.

12. An apparatus, comprising:
a persistent current switch comprising a superconducting material which is electrically superconducting at a superconducting temperature and electrically resistive at a resistive mode temperature which is greater than the superconducting temperature;
a first heat exchange element thermally coupled to a first stage element of a cold head;
a convective heat dissipation loop thermally coupling the persistent current switch to the first heat exchange element;
a second heat exchange element spaced apart from the first heat exchange element and thermally coupled to a second stage element of the cold head wherein the second heat exchange element is not included in the convective heat dissipation loop thermally coupling the persistent current switch to the first heat exchange element; and
a thermally conductive link thermally coupling the persistent current switch to the second heat exchange element;
wherein the thermally conductive link comprises a material which has a first thermal conductivity at the superconducting temperature and has a second thermal conductivity at a second temperature which is greater than the superconducting temperature, wherein the first thermal conductivity is greater than the second thermal conductivity.

13. The apparatus of claim 12, wherein the convective heat dissipation loop comprises a two phase heat pipe.

14. The apparatus of claim 12, further comprising a cryostat having:
an enclosure; and
a thermal shield disposed within the enclosure and defining a thermal insulation region disposed between the thermal shield and the enclosure.

15. The apparatus of claim 14, wherein the first heat exchange element includes the thermal shield.

16. The apparatus of claim 14, wherein the thermal insulation region comprises a vacuum.

17. The apparatus of claim 12, further comprising a persistent current switch heater disposed within the enclosure and configured to be selectively activated and deactivated, wherein when the persistent current switch heater is activated it heats the persistent current switch to the resistive mode temperature.

18. The apparatus of claim 12, further comprising;
an electrically conductive coil; and
a superconducting convection cooling loop disposed within the enclosure and connected to the second heat exchange element, the superconducting convection cooling loop having a cryogenic fluid disposed therein and being configured to cool the electrically conductive coil to the superconducting temperature.

* * * * *